(12) United States Patent
Takagi

(10) Patent No.: US 9,865,563 B2
(45) Date of Patent: Jan. 9, 2018

(54) WIRE TENSIONER

(71) Applicant: SHINKAWA LTD., Tokyo (JP)

(72) Inventor: Yoshitaka Takagi, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 15/245,193

(22) Filed: Aug. 24, 2016

(65) Prior Publication Data
US 2016/0365331 A1  Dec. 15, 2016

Related U.S. Application Data

(63) Continuation of application No. PCT/JP2015/053669, filed on Feb. 10, 2015.

(30) Foreign Application Priority Data

Feb. 24, 2014 (JP) ................................. 2014-032934

(51) Int. Cl.
*H01L 23/00* (2006.01)
*B23K 20/00* (2006.01)

(52) U.S. Cl.
CPC ............ *H01L 24/78* (2013.01); *B23K 20/004* (2013.01); *H01L 2224/78301* (2013.01); *H01L 2224/78611* (2013.01); *H01L 2224/78631* (2013.01); *H01L 2924/00014* (2013.01)

(58) Field of Classification Search
CPC . H01L 2924/00014; H01L 2224/45015; H01L 2224/45099; H01L 2924/207; H01L 2224/78301; H01L 2224/78611; H01L 2224/78631; H01L 24/78; B23K 20/004
See application file for complete search history.

(56) References Cited

U.S. PATENT DOCUMENTS 4,069,961 A * 1/1978 Nicklaus ................. H01L 24/85
                                                                    226/97.4
4,172,544 A * 10/1979 Pennings ................ H01L 24/85
                                                                    226/195

(Continued)

FOREIGN PATENT DOCUMENTS

JP     H06-252197     9/1994
JP     H07-221133     8/1995

(Continued)

*Primary Examiner* — Erin Saad
*Assistant Examiner* — Carlos Gamino
(74) *Attorney, Agent, or Firm* — JCIPRNET

(57) ABSTRACT

A wire tensioner has a wire passage through which a wire is inserted. The wire passage include: an inlet through which a compressed gas enters; a first outlet through which the compressed gas is discharged and is provided on an upper side of the inlet; a first flow contraction portion provided on the upper side of the inlet, and for contracting an area of the wire passage; a second flow contraction portion provided on a lower side of the inlet, and for contracting the area of the wire passage; a third flow contraction portion provided on a side of a bonding tool of the second flow contraction portion, and for making the flow of the compressed gas to the side of the bonding tool contracted; and a second outlet through which the compressed gas is discharged and is provided on the lower side of the second flow contraction portion.

7 Claims, 5 Drawing Sheets

(56) References Cited

U.S. PATENT DOCUMENTS

| | | | | |
|---|---|---|---|---|
| 4,928,871 A * | 5/1990 | Farassat | ............... | B23K 20/007 228/180.5 |
| 5,191,680 A * | 3/1993 | Kaneko | .................... | D04H 3/16 19/299 |
| 5,402,927 A * | 4/1995 | Frasch | ................. | B23K 20/007 228/180.5 |
| 5,685,476 A * | 11/1997 | Miyoshi | ............... | B23K 20/007 228/180.5 |
| 6,495,789 B2 * | 12/2002 | Baiardi | ................. | B23H 7/265 219/69.12 |
| 7,954,689 B2 * | 6/2011 | Kwan | ................. | B23K 20/004 228/4.5 |
| 8,459,530 B2 * | 6/2013 | Zhang | ................. | B23K 20/005 228/180.5 |
| 9,397,066 B2 * | 7/2016 | Wang | .................... | B65H 51/18 |
| 2002/0027152 A1 * | 3/2002 | Ushiki | ................. | B23K 20/004 228/4.5 |
| 2006/0091181 A1 | 5/2006 | Eder et al. | | |
| 2006/0219754 A1 * | 10/2006 | Clauberg | ................. | B08B 7/00 228/4.5 |
| 2008/0272178 A1 | 11/2008 | Kwan et al. | | |

FOREIGN PATENT DOCUMENTS

| | | |
|---|---|---|
| JP | 2002083837 | 3/2002 |
| JP | 4700633 | 6/2011 |

\* cited by examiner

WIRE TENSIONER

CROSS REFERENCE TO RELATED APPLICATIONS

This application is a Continuation of PCT International Application No. PCT/JP2015/053669, filed on Feb. 10, 2015, which claims priority under 35 U.S.C. §119(a) to Patent Application No. 2014-032934, filed in Japan on Feb. 24, 2014, all of which are hereby expressly incorporated by reference into the present application.

TECHNICAL FIELD

The present invention relates to a wire tensioner for applying tension to a wire used in wire bonding, and in particular to an improvement of a structure of such a wire tensioner.

BACKGROUND ART

Conventionally, a wire-bonding apparatus for connecting an electrode of a chip with an electrode of a substrate via a metallic wire has been known. Some examples of such a wire-bonding apparatus employ a wire tensioner for applying a wire with predetermined tension during wire bonding.

Patent Literature 1 describes a wire tensioner for applying a wire with back tension and provided between a capillary as a bonding tool and a wire spool for supplying a wire to the capillary. The wire tensioner is provided with a wire passage through which a wire passes from a wire spool side to a capillary side. The wire passage includes an inlet through which a compressed fluid enters, and an outlet that is disposed on the wire spool side of the inlet and through which the compressed fluid within the wire passage is discharged. The wire is pulled to the wire spool side by the compressed fluid that flows from the inlet to the outlet through the wire passage. In other words, a fluid resistance of the compressed fluid that flows through the wire passage applies the wire with back tension. Further, the wire passage also includes flow contraction portions having a smaller diameter than that of the inlet and the outlet. The flow contraction portions are respectively provided on the capillary side of the inlet and on the wire spool side of the outlet. As the flow contraction portions restrict passing of the compressed fluid, a flow of the compressed fluid from the inlet to the outlet is formed within the wire passage.

Patent Literature 2 describes a wire tensioner that applies a wire with predetermined tension in a direction toward a wire spool. To the wire tensioner, an air supply source for supplying compressed air, and a vacuum feeding source for producing a vacuum suction force by vacuuming are connected. The wire tensioner is configured such that the compressed air supplied to a wire passage by the air supply source is discharged through an outlet on the wire spool side. This configuration produces a fluid resistance of a fluid flowing from downstream to upstream of the wire passage, and a wire is applied with certain tension by this fluid resistance. The wire tensioner is also configured such that outer air that is suctioned through a capillary-side end of the wire passage flows through the wire passage to the vacuum feeding source by a vacuum suction force applied to the wire passage. This configuration produces a fluid resistance of a fluid flowing from downstream to upstream of the wire passage, and the wire is applied with certain tension by this fluid resistance.

Patent Literature 3 describes a wire cleaning guide through which a gas for plasma is supplied to clean a wire inserted therethrough. The wire cleaning guide includes a larger guide hole having a larger diameter and disposed on a spool side, a smaller guide hole having a diameter smaller than that of the larger guide hole and disposed on a capillary side, and a gas supply nozzle connected between these guide holes. The gas for plasma supplied from the gas supply nozzle flows toward the larger guide hole on the spool side, and this flow applies the wire with tension.

CITATION LIST

Patent Literature

Patent Literature 1: US Unexamined Patent Application Publication No. 2006/0091181
Patent Literature 2: Japanese Unexamined Patent Application Publication No. 2002-83837
Patent Literature 3: Japanese Patent No. 4700633

SUMMARY

Technical Problem

As described above, the wire passage of the wire tensioner described in Patent Literature 1 has the flow contraction portion having a diameter smaller than that of the inlet and the outlet on the wire spool side of the outlet. With this configuration, the flow contraction portion restricts the flow of the compressed gas upward from the outlet, and the compressed gas within the wire passage is discharged positively through the outlet. As a result, a flow amount of the compressed gas discharged through an upper end of the wire passage decreases, and therefore a jet flow of the compressed gas discharged through the upper end of the wire passage suppresses wobbling of the wire above the wire tensioner. However, with the wire tensioner described in Patent Literature 1, a flow amount of the compressed gas discharged through a lower end of the wire passage is not sufficiently restricted, and therefore the wire below the wire tensioner wobbles due to a jet flow of the compressed gas discharged through the lower end of the wire passage.

Further, generally with the wire-bonding apparatus, a bonding arm having an ultrasonic horn that is not illustrated has a characteristic of expanding and contracting resulting from changes over time due to heat. When the bonding arm having such a characteristic is influenced by the jet flow of the compressed gas discharged from the lower end of the wire passage, this jet flow becomes a disturbance and results in a problem that correction control between the bonding arm and a camera offset is not correctly performed.

In order to solve this problem, as the wire tensioner described in Patent Literature 2, a configuration in which outer air is suctioned by a vacuum suction force through a hole at a lower end of a wire passage can be considered. However, this configuration requires a vacuum feeding source, in addition to a compressed gas source, and complicates its structure.

The present invention provides a wire tensioner capable of suppressing an influence to a side of a bonding tool with a simple structure.

Solution to Problem

An aspect of the present invention provides a wire tensioner used for a wire-bonding apparatus, the wire tensioner including: a main body; a compressed gas supply channel; a connection port configured to connect the main body and the compressed gas supply channel; a tubular unit through which a compressed gas is supplied from the compressed gas supply channel via the connection port; and a wire passage provided in the tubular unit, the wire passage constituting a passage through which the wire runs from a side of a wire spool to a side of a bonding tool, wherein the wire passage includes: an inlet through which the compressed gas enters; a first outlet through which the compressed gas within the wire passage is discharged to an atmosphere, the first outlet being provided on the side of the wire spool of the inlet; a first flow contraction portion provided on the side of the wire spool of the inlet, and configured to narrow an area of the wire passage to make a flow of the compressed gas to the side of the wire spool contracted; a second flow contraction portion provided on the side of the bonding tool of the inlet, and configured to narrow an area of the wire passage to make a flow of the compressed gas to the side of the bonding tool contracted; and a second outlet through which the compressed gas within the wire passage is discharged to an atmosphere, the second outlet being provided on the side of the bonding tool of the second flow contraction portion.

Further, it is preferable that there is provided a third flow contraction portion provided on the side of the bonding tool of the second flow contraction portion, and configured to narrow an area of the wire passage to make the flow of the compressed gas to the side of the bonding tool contracted.

Moreover, it is preferable that an area of the wire passage between the second flow contraction portion and the third flow contraction portion is greater than the area of the flow contraction portions.

Furthermore, it is preferable that the wire tensioner is provided between the bonding tool and the wire spool for supplying a wire to the bonding tool.

Further, the wire tensioner is disposed above an oxidation protection unit configured to prevent oxidation of a surface of a free air ball formed near a tip of the bonding tool.

Moreover, it is preferable that an area of the first flow contraction portion is smaller than an area of the first outlet.

Furthermore, it is preferable that an area of the third flow contraction portion is smaller than an area of the second outlet.

Advantageous Effects of Invention

The wire tensioner according to the present invention is able to suppress an influence to a side of a bonding tool with a simple structure.

DESCRIPTION OF EMBODIMENT

Hereinafter, an embodiment of a wire tensioner according to the present invention will be described with reference to the drawings.

Figure 1:
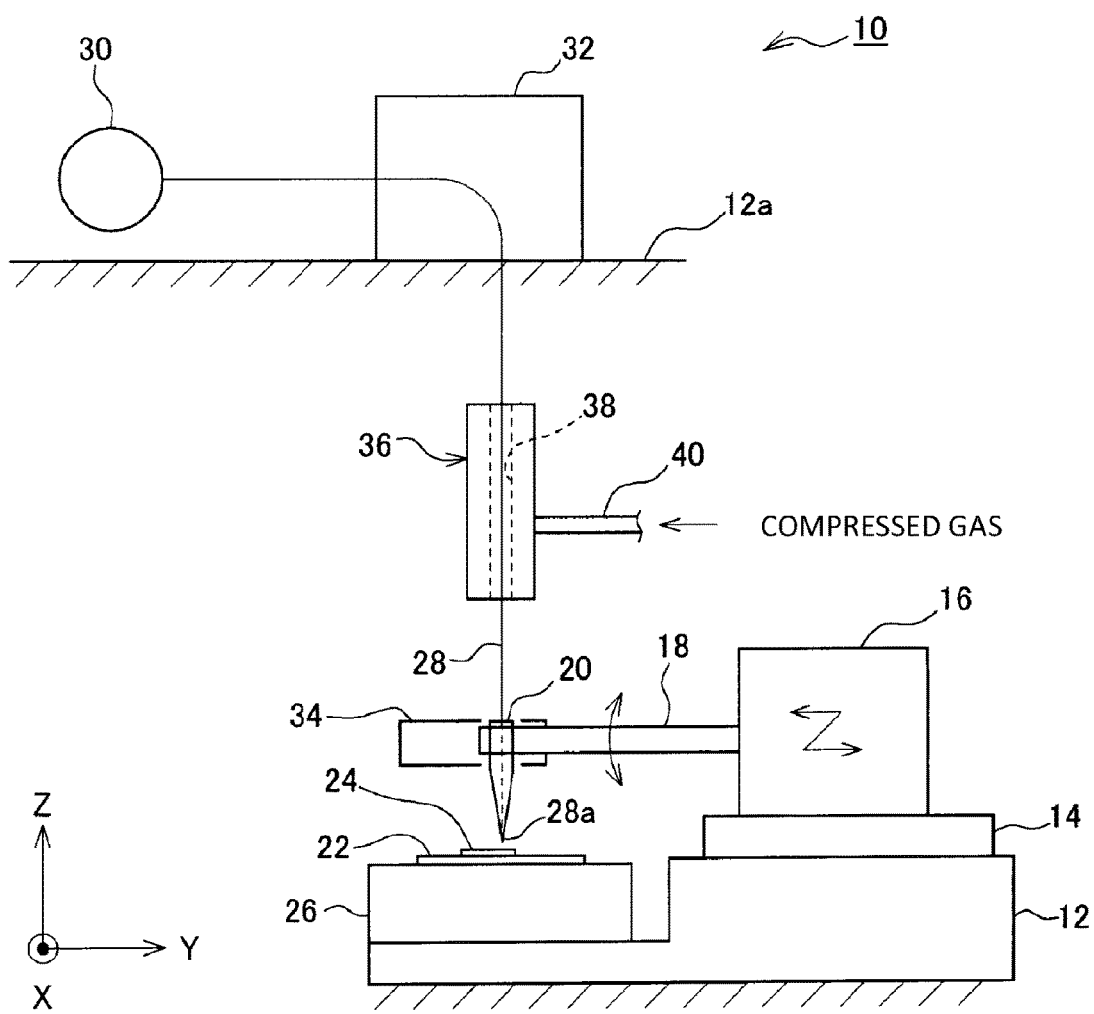
FIG. 1 is a diagram illustrating a configuration of a wire-bonding apparatus according to this embodiment.

First, a wire-bonding apparatus 10 employing a wire tensioner will be described with reference to FIG. 1. FIG. 1 is a diagram illustrating a configuration of the wire-bonding apparatus 10 according to this embodiment.

The wire-bonding apparatus 10 includes: a base 12 as a base body; an XY table 14 attached on the base 12, an upper surface of which table moves in an XY direction; a bonding head 16 attached on the upper surface of the XY table 14; and a bonding arm 18 for moving a capillary 20 in a Z direction using a Z-direction driving mechanism provided within the bonding head 16, the capillary 20 being a bonding tool attached to a tip of the aim. In other words, the bonding head 16 is able to move the capillary 20 in a XYZ direction, using the XY table 14 and by moving the bonding aim 18 in the Z direction using the Z-direction driving mechanism.

Further, a bonding stage 26 is attached to the base 12 of the wire-bonding apparatus 10. The bonding stage 26 suctions and fixes a substrate 22 on which a semiconductor die 24 to which wire bonding is performed is attached. It should be noted that in FIG. 1, an up-down direction of the wire-bonding apparatus 10 corresponds to the Z direction, a direction from the bonding stage 26 toward the bonding head 16 corresponds to a Y direction, and a direction perpendicular to a YZ plane corresponds to the X direction.

To an upper frame 12a fixed to the base 12, a wire spool 30 for feeding a wire 28 to the capillary 20, and an air guide 32 for converting a feeding direction of the wire 28 fed from the wire spool 30 to the Z direction are attached.

Moreover, the wire-bonding apparatus 10 includes an oxidation protection unit 34 for protecting a surface of a free air ball (not shown) from oxidation by maintaining a region where the free air ball is formed at a wire tail 28a extending from a tip of the capillary 20 in an antioxidant gas atmosphere. The oxidation protection unit 34 is attached to the bonding head 16, and configured to move in the XY direction along with the bonding head 16.

Furthermore, a wire tensioner 36 for applying the wire 28 with tension is provided between the capillary 20 and the air guide 32. As illustrated in FIG. 1, the wire 28 is inserted into the wire tensioner 36 so as to run through the wire tensioner 36 in the Z direction.

In the wire tensioner 36, a wire passage 38 through which the wire 28 passes in the Z direction is provided. To the wire tensioner 36, a compressed gas supply channel 40 for supplying a compressed gas, e.g., compressed air, to the wire passage 38 from a compressed gas source (not shown) is connected.

Figure 2:
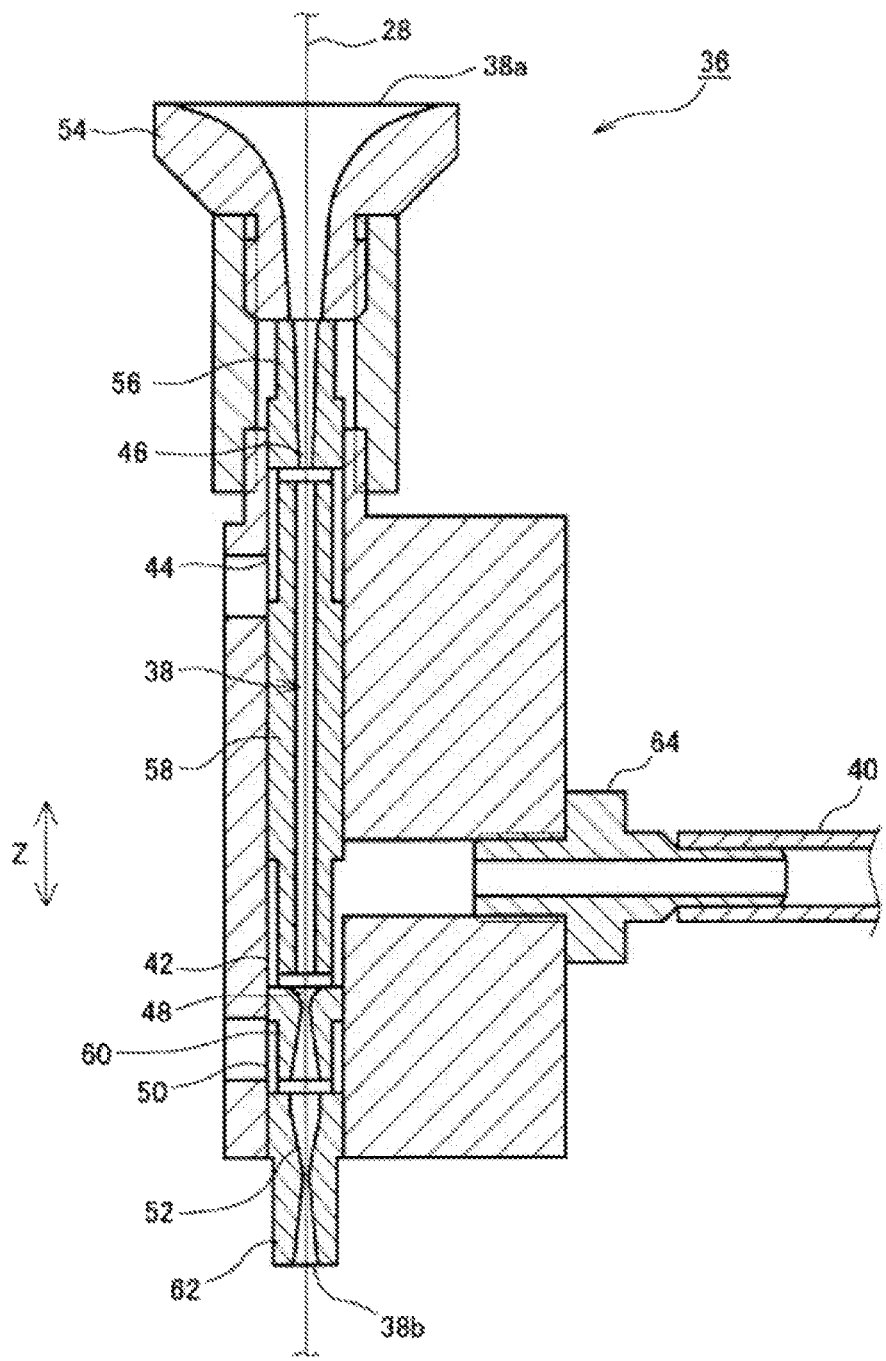
FIG. 2 is a sectional view of a wire tensioner according to this embodiment.
Figure 3:
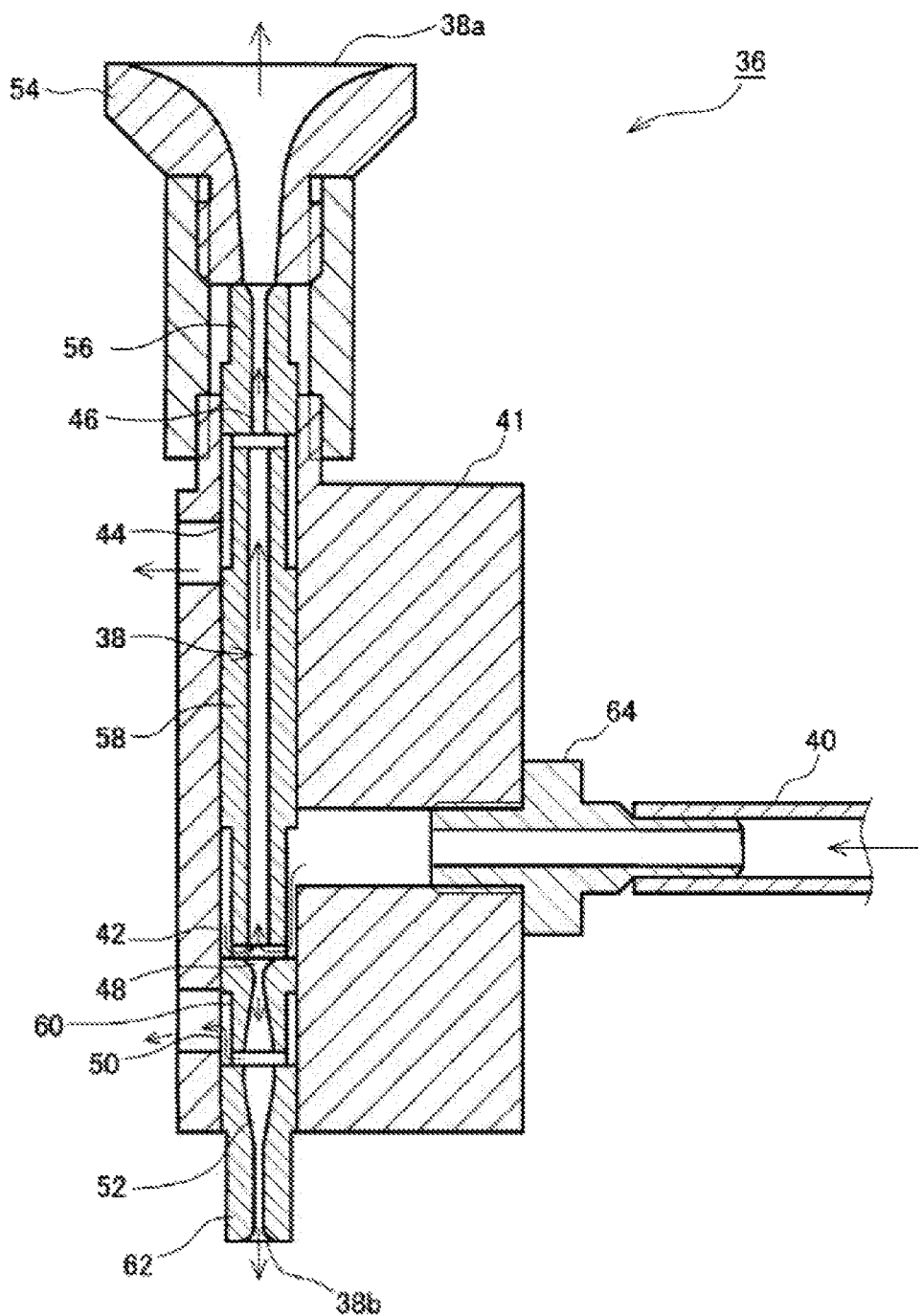
FIG. 3 is a diagram illustrating a flow of a compressed gas within the wire tensioner.

The configuration of the wire tensioner 36 will now be described with reference to FIGS. 2 and 3. FIG. 2 is a sectional view of the wire tensioner 36 according to this embodiment, and FIG. 3 is a diagram illustrating a flow of the compressed gas within the wire tensioner 36. It should be noted that in FIGS. 2 and 3, an up-down direction of the wire tensioner 36 corresponds to the Z direction. While not illustrated, the wire spool 30 and the air guide 32 are positioned above the wire tensioner 36, and the capillary 20 as a bonding tool and the oxidation protection unit 34 are positioned under the wire tensioner 36. Therefore, a side on which the wire spool 30 and the air guide 32 are positioned is simply referred to as an upper side, and a side of the wire tensioner 36 on which the capillary 20 and the oxidation protection unit 34 are positioned is simply referred to as a lower side.

The wire passage 38 includes an inlet 42 through which a compressed gas enters, a first outlet 44 that is provided on the upper side of the inlet 42 and through which the compressed gas within the wire passage 38 is discharged, a first flow contraction portion 46 provided on the upper side of the inlet 42 and for contracting a flow of the compressed gas to the upper side, and a second flow contraction portion 48 provided on the lower side of the inlet 42 and for contracting the flow of the compressed gas to the lower side.

As the second flow contraction portion 48 restricts the flow of the compressed gas to the lower side from the inlet 42, the compressed gas that has entered through the inlet 42 flows to the upper side through the wire passage 38. Due to a fluid resistance of the flow of the compressed fluid flowing to the upper side, the wire 28 is applied with tension pulling to the upper side.

In addition, as the first flow contraction portion 46 restricts the flow of the compressed gas to the upper side from the first outlet 44, the compressed gas within the wire passage 38 is positively discharged to an atmosphere through the first outlet 44. As a result, a flow amount of the compressed gas discharged through an upper end 38a of the wire passage 38 decreases, and therefore it is possible to suppress wobbling of the wire 28 on the upper side of the wire tensioner 36 due to a jet flow of the compressed gas discharged from the upper end.

Further, the wire passage 38 according to this embodiment includes a second outlet 50 provided on the lower side of the second flow contraction portion 48 and for discharging the compressed gas within the wire passage 38 to the atmosphere, and a third flow contraction portion 52 provided on the lower side of the second flow contraction portion 48 and for contracting the flow of the compressed gas to the lower side.

As the third flow contraction portion 52 restricts the flow of the compressed gas to the lower side from the second outlet 50, the compressed gas that has passed the second flow contraction portion 48 is positively discharged to the atmosphere through the second outlet 50. As a result, a flow amount of the compressed gas discharged through a lower end 38b of the wire passage 38 drastically decreases, and therefore it is possible to suppress wobbling of the wire 28 on the lower side of the wire tensioner 36 due to a jet flow of the compressed gas discharged from the lower end. Further, as the jet flow of the compressed gas discharged from the lower end 38b of the wire passage 38 drastically decreases, it is possible to largely reduce an influence to the antioxidant gas atmosphere generated within the oxidation protection unit 34 provided on the lower side of the wire tensioner 36. Specifically, it is possible to largely reduce a disturbance in the antioxidant gas atmosphere in the region of the free air ball due to the jet flow of the compressed gas, and to ensure suppression of oxidation over the surface of the wire 28 within the oxidation protection unit 34.

Next, a specific configuration of the wire tensioner 36 will be described. The wire tensioner 36 includes a main body 41. The main body 41 is provided with, in order from the upper side to the lower side, a diffuser unit 54, a first nozzle unit 56, a tubular unit 58, a second nozzle unit 60, and a third nozzle unit 62. Each of these members is provided with a through hole through which the wire 28 can be inserted, and the wire passage 38 is constituted by the through holes continuously arranged in a line.

The wire passage 38 in the diffuser unit 54 is configured such that an area of the wire passage 38 gradually increases from the lower side to the upper side, that is, toward the upper end 38a. The area of the wire passage 38 represents an area of a cross-sectional plane perpendicular to the Z direction. The area of the wire passage 38 is proportional to square of a radius of an inner diameter of the wire passage 38. In this manner, as the area of the wire passage 38 gradually increases toward the upper end 38a, a speed of the compressed gas flowing therethrough decreases. As a result, the jet flow of the compressed gas discharged through the upper end 38a becomes weaker, and therefore it is possible to suppress wobbling of the wire 28 on the upper side of the wire tensioner 36.

The wire passage 38 in the first nozzle unit 56 includes the first flow contraction portion 46 having an area smaller than a cross-sectional area of the first outlet 44. The first flow contraction portion 46 serves as a resistance, and the flow of the compressed gas directed from the tubular unit 58 toward the diffuser unit 54 is restricted.

The first outlet 44 is provided between the tubular unit 58 and the first nozzle unit 56, and the inlet 42 is provided between the tubular unit 58 and the second nozzle unit 60. The first outlet 44 is open to an atmosphere, and the inlet 42 is provided so as to communicate with the main body 41. The main body 41 and the compressed gas supply channel 40 are connected via a connection port 64. The compressed gas within the compressed gas supply channel 40 is supplied to the wire passage 38 within the tubular unit 58 through the inlet 42. Then, as the compressed gas within the wire passage 38 flows through the tubular unit 58 to the upper side, the wire 28 is applied with back tension due to the fluid resistance.

The wire passage 38 in the second nozzle unit 60 includes the second flow contraction portion 48 having an area smaller than the area of the wire passage 38 in the tubular unit 58. The second flow contraction portion 48 serves as a resistance, and the flow of the compressed gas directed from the tubular unit 58 toward the third nozzle unit 62 is restricted.

The second outlet 50 is provided between the second nozzle unit 60 and the third nozzle unit 62. The second outlet 50 is open to the atmosphere. The wire passage 38 in the third nozzle unit 62 includes the third flow contraction portion 52 having an area smaller than a cross-sectional area of the second outlet 50. The third flow contraction portion 52 serves as a resistance, and the flow of the compressed gas discharged from the lower end 38b is restricted. Further, it is preferable that the cross-sectional area of the wire passage 38 between the second flow contraction portion 48 and the third flow contraction portion 52 is greater than either of the cross-sectional areas of the flow contraction portions 48 and 52. With this configuration, the compressed gas is positively discharged through the second outlet 50 between the flow contraction portions 48 and 52, and the flow amount of the compressed gas that has passed the third flow contraction portion 52 and discharged through the lower end 38b largely decreases.

FIG. 3 shows the flow of the compressed gas in the wire tensioner 36 by arrows. The compressed gas supplied from the compressed gas supply channel 40 enters the wire passage 38 through the inlet 42. On the lower side of the inlet 42, the second flow contraction portion 48 is positioned to restrict a flow rate therethrough. Therefore, most of the compressed gas flows through the tubular unit 58 to the upper side. By the flow to the upper side, tension is applied to the wire 28 (shown in FIG. 2). The main body 41 is configured to provide a first space between the first nozzle unit 56 and the tubular unit 58, a second space between the tubular unit 58 and the second nozzle unit 60, a third space between the second nozzle unit 60 and the third nozzle unit 62, and hold the first nozzle unit 56, the tubular unit 58, the second nozzle unit 60, and the third nozzle unit 62.

Further, the first outlet 44 is positioned at an upper end of the tubular unit 58, and the first flow contraction portion 46 is positioned at an upper end of the first outlet 44 to limit a flow rate therethrough. Therefore, most of the compressed gas within the tubular unit 58 is discharged through the first outlet 44 to the atmosphere. While the first outlet 44 is shown at a position downstream from the first flow contraction portion 46 in this embodiment, the position of the first outlet 44 in a height direction can be on the upper side of the first flow contraction portion 46.

The compressed gas that has passed the first flow contraction portion 46 is released to the atmosphere through the upper end 38a while reducing its speed by the diffuser unit 54. As the jet flow of the compressed gas through the upper end 38a becomes weaker, it is possible to suppress wobbling of the wire 28 on the upper side of the wire tensioner 36 due to the jet flow.

In contrast, most of the compressed gas that has passed the second flow contraction portion 48 is discharged to the atmosphere through the second outlet 50. Specifically, the second outlet 50 is positioned at a lower end of the second flow contraction portion 48, and the third flow contraction portion 52 is positioned at a lower end of the second outlet 50 to limit a flow rate therethrough. Therefore, the compressed gas that has passed the second flow contraction portion 48 is positively discharged to the atmosphere through the second outlet 50. Then, a small amount of the compressed gas that has passed third flow contraction portion 52 is discharged to the atmosphere through the lower end 38b. While the second outlet 50 is shown at a position between the second flow contraction portion 48 and the third flow contraction portion 52 in this embodiment, the position of the second outlet 50 in the height direction can be on the lower side of the third flow contraction portion 52. Further, while the first outlet 44 and the second outlet 50 are shown to perform discharge to a left side in the figure as shown in FIG. 3 in this embodiment, the discharge can be performed to any direction as long as the direction is radial with respect to a central axis of the wire passage 38 in a longitudinal direction.

Figure 4:
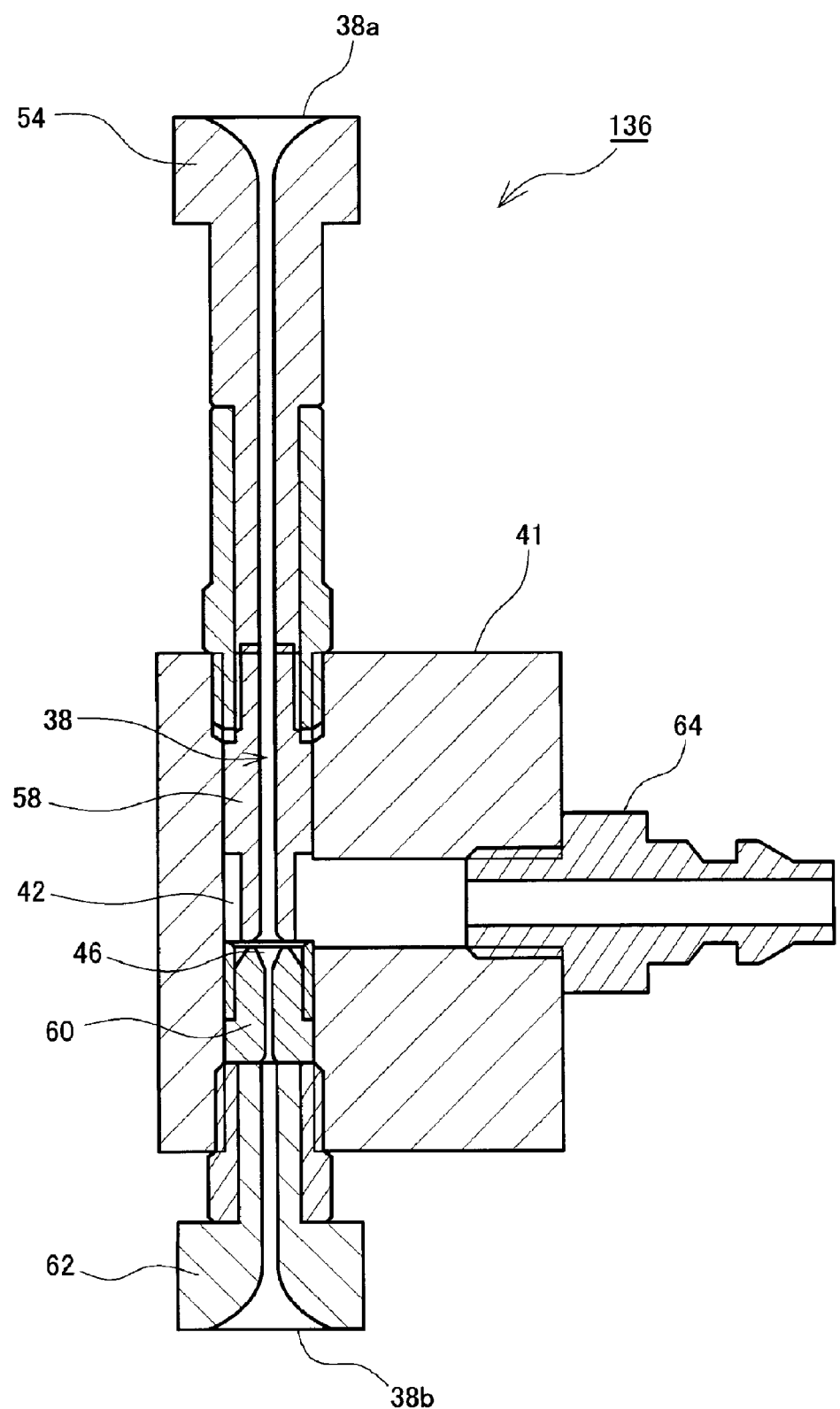
FIG. 4 is a sectional view of a wire tensioner according to the conventional technique.
Figure 5:
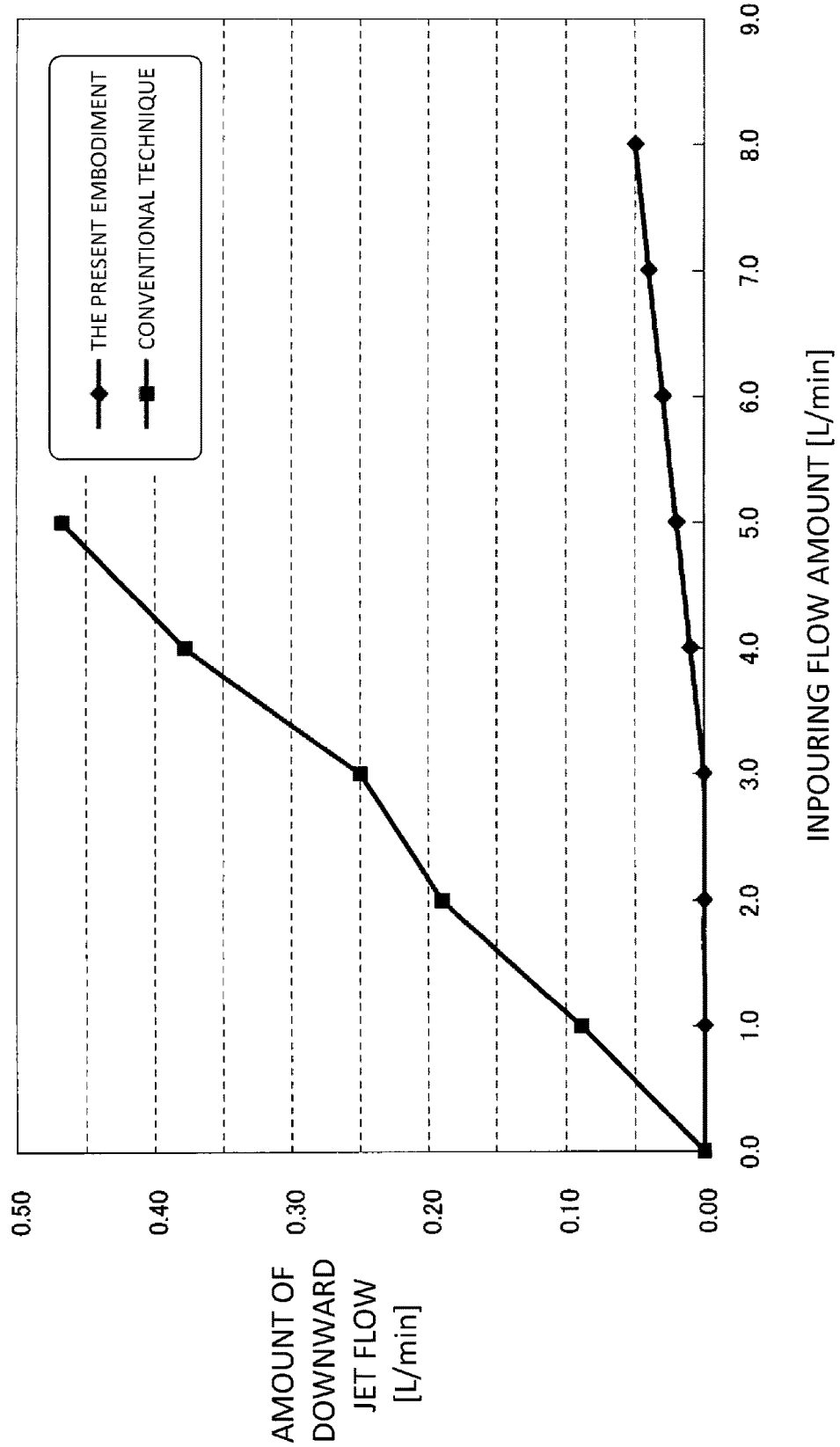
FIG. 5 is a chart comparing downward jet flow amounts between the wire tensioner according to this embodiment and of the wire tensioner according to the conventional technique.

Next, downward jet flow amounts of the wire tensioner 36 according to this embodiment and of a wire tensioner 136 according to the conventional technique will be described with reference to FIGS. 4 and 5. FIG. 4 is a sectional view of the wire tensioner 136 according to the conventional technique, and FIG. 5 is a chart comparing downward jet flow amounts between the wire tensioner 36 according to this embodiment and of the wire tensioner 136 according to the conventional technique. Here, in FIG. 4, like components of the wire tensioner 136 as in the wire tensioner 36 according to this embodiment are denoted by like reference numerals, and detailed descriptions of those components shall be omitted. Further, the wire tensioner 136 according to the conventional technique shown in FIG. 4 does not include the first outlet 44, the second flow contraction portion 48, the second outlet 50, and the third flow contraction portion 52 that constitute the wire passage 38 of the wire tensioner 36 according to this embodiment.

FIG. 5 is the chart showing the downward jet flow amounts of the wire tensioner 36 according to this embodiment and of the wire tensioner 136 according to the conventional technique when compressed air of a predetermined amount enters. As shown in this chart, at the same inpouring flow amount, the downward jet flow amount of the wire tensioner 36 according to this embodiment is far smaller than that of the wire tensioner 136 according to the conventional technique. Specifically, under a condition that the inpouring flow amount of the compressed air is 5 liters/min, the downward jet flow amount of the wire tensioner 36 according to this embodiment can be limited to 5% or a smaller percentage of the jet flow amount of the wire tensioner 136 according to the conventional technique.

With this configuration, it is possible to suppress wobbling of the wire 28 on the lower side of the wire tensioner 36 due to the jet flow. Further, by reducing the jet flow to the lower side, it is possible to improve stability of an oxidation gas atmosphere within the oxidation protection unit 34. Moreover, as cooling of the capillary 20 by the jet flow is also suppressed, it is possible to reduce expansion and contraction of the bonding aim 18 due to the temperature change, and as a result, to improve positional accuracy in wire bonding.

The present invention is not limited to the embodiment described above, and can include any alterations and modifications without departing from the technical scope of the present invention defined in the appended claims and the spirit of the present invention.

The invention claimed is:

1. A wire tensioner used for a wire-bonding apparatus, the wire tensioner comprising:
    a first nozzle unit a tubular unit, a second nozzle unit and a third nozzle unit which are disposed in that order from an upper side to a lower side of the wire tensioner;
    a main body, configured to provide a first space between the first nozzle unit and the tubular unit, a second space between the tubular unit and the second nozzle unit, a third space between the second nozzle unit and the third nozzle unit, and hold the first nozzle unit the tubular unit, the second nozzle unit, and the third nozzle unit;
    a compressed gas supply channel;
    a connection port, configured to connect the main body and the compressed gas supply channel and to supply a compressed gas to the second space;
    wherein the first nozzle unit, the tubular unit, the second nozzle unit, and the third nozzle unit configure a wire passage through which a wire runs from a side of a wire spool to a side of a bonding tool;
    the main body having a first outlet and second outlet;
    the first outlet being provided on the side of the wire spool of the second space, wherein the compressed gas having flowed through the second space and into the first space is then discharge through the first outlet to an atmosphere;
    the second outlet being provided on the side of the bonding tool of the second space, wherein the compressed gas having flowed through the second space and into the third space is then discharge through the second outlet to an atmosphere;
    the first nozzle unit having a first flow contraction portion configured to narrow an area of the wire passage to make a flow of the compressed gas to the side of the wire spool contracted;
    the second nozzle unit having a second flow contraction portion configured to narrow an area of the wire passage to make a flow of the compressed gas to the side of the third nozzle unit contracted; and
    the third nozzle unit having a third flow contraction portion configured to narrow an area of the wire passage to make a flow of the compressed gas to the side of the bonding tool contracted.

2. The wire tensioner according to claim 1, wherein:
the third flow contraction portion, provided on the side of the bonding tool of the second flow contraction portion, and configured to narrow the area of the wire passage to make the flow of the compressed gas to the side of the bonding tool contracted.

3. The wire tensioner according to claim 2, wherein
an area of the wire passage between the second flow contraction portion and the third flow contraction portion is greater than either of areas of the second flow contraction portion and the third flow contraction portion.

4. The wire tensioner according to claim 1, wherein
the wire tensioner is provided between the bonding tool and the wire spool for supplying the wire to the bonding tool.

5. The wire tensioner according to claim 1, wherein
the wire tensioner is disposed above an oxidation protection unit configured to prevent oxidation of a surface of a free air ball formed near a tip of the bonding tool.

6. The wire tensioner according to claim 1, wherein
an area of the first flow contraction portion is smaller than an area of the first outlet.

7. The wire tensioner according to claim 2, wherein
an area of the third flow contraction portion is smaller than an area of the second outlet.

* * * * *